(12) United States Patent
Turner

(10) Patent No.: US 6,331,233 B1
(45) Date of Patent: Dec. 18, 2001

(54) TANTALUM SPUTTERING TARGET WITH FINE GRAINS AND UNIFORM TEXTURE AND METHOD OF MANUFACTURE

(75) Inventor: Stephen P. Turner, Moon, PA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/497,079

(22) Filed: Feb. 2, 2000

(51) Int. Cl.⁷ .................................................. C23C 14/34
(52) U.S. Cl. ................... 204/298.13; 204/298.12; 420/427; 148/422; 428/457
(58) Field of Search ............... 204/298.12, 298.13; 420/427; 148/422; 428/457

(56) References Cited

U.S. PATENT DOCUMENTS

| | | | |
|---|---|---|---|
| 4,525,417 | 6/1985 | Dimigen et al. | 428/244 |
| 4,619,695 | 10/1986 | Oikawa et al. | 75/63 EB |
| 4,663,120 | 5/1987 | Parent et al. | 419/10 |
| 4,762,558 | 8/1988 | German et al. | 75/246 |
| 4,842,706 | 6/1989 | Fukasawa et al. | 204/298 |
| 4,889,745 | 12/1989 | Sata | 427/12 |
| 4,960,163 | 10/1990 | Fang et al. | 164/459 |
| 5,074,907 | 12/1991 | Amato et al. | 75/235 |
| 5,087,297 | 2/1992 | Pouliquen | 148/2 |
| 5,282,946 | 2/1994 | Kinoshita et al. | 204/298.13 |
| 5,330,701 | 7/1994 | Shaw et al. | 419/10 |
| 5,400,633 | 3/1995 | Segal et al. | 75/272 |
| 5,418,071 | 5/1995 | Satou et al. | 428/552 |
| 5,468,401 | 11/1995 | Lum et al. | 252/22 |
| 5,508,000 | 4/1996 | Satou et al. | 419/31 |
| 5,513,512 | 5/1996 | Segal | 72/253.1 |
| 5,590,389 | 12/1996 | Dunlop et al. | 419/67 |
| 5,600,989 | 2/1997 | Segal et al. | 72/253.1 |
| 5,608,911 | 3/1997 | Shaw et al. | 419/45 |
| 5,673,581 | 10/1997 | Segal | 72/184 |
| 5,693,203 | 12/1997 | Ohhashi et al. | 204/248.12 |
| 5,772,860 | 6/1998 | Sawada et al. | 204/298.13 |
| 5,780,755 | 7/1998 | Dunlop et al. | 75/249 |
| 5,798,005 | 8/1998 | Murata et al. | 148/421 |
| 5,809,393 | 9/1998 | Dunlop et al. | 419/61 |
| 5,993,575 | 11/1999 | Lo et al. | 148/577 |
| 5,993,621 | 11/1999 | Liu | 204/298.12 |

FOREIGN PATENT DOCUMENTS

| | | | |
|---|---|---|---|
| 0 590 904 | 4/1994 | (EP) | C23C/14/34 |
| 6-10107 | 6/1992 | (JP) | C22F/1/18 |
| 6-93400 | 9/1992 | (JP) | C22F/1/18 |
| 6-256919 | 3/1993 | (JP) | C22F/1/18 |
| 6-264232 | 9/1994 | (JP) | C23C/14/34 |
| 8-232061 | 9/1996 | (JP) . | |
| 8-269701 | 10/1996 | (JP) . | |
| WO-87/07650-A | * 12/1987 | (WO) | C23C/14/34 |
| WO 92/01080 | 1/1992 | (WO) | C23C/14/34 |
| WO-99/66100-A | * 12/1999 | (WO) | C23C/14/34 |
| WO 00/31310 | 6/2000 | (WO) | C22B/24/24 |

OTHER PUBLICATIONS

Klein, C. et al., "Manual of Mineralogy", John Wiley & Sons, Inc. 1985, pp. 39–40.
Wright, S. et al., "Effect of Annealing Temperature on the Texture of Rolled Tantalum and Tantalum–10 Wt.% Tungsten", Proceedings of the 2nd Internatl. Conf. on Tungsten and Refractory Metals, 1994, pp. 501–508.
Wenk, Hans–Rudolf, "Preferred Orientation in Deformed Metals and Rocks: An Introduction to Modern Texture Analysis", Academic Press 1985, pp. 8–10.
Cullity, B., "Elements of X–Ray Diffraction, Second Edition", Addison–Wesley Pub. Co., Inc., pp. 294–297.
U.S. application No. 09/098,760, Shah et al., filed Jun. 17, 1998.

* cited by examiner

Primary Examiner—Nam Nguyen
Assistant Examiner—Steven H. VerSteeg
(74) Attorney, Agent, or Firm—Wells St. John, P.S.

(57) ABSTRACT

A method for producing a tantalum sputtering component includes a minimum of three stages each of which include a deformation step followed by an inert atmosphere high-temperature anneal. Temperatures of each of the anneal steps can be different from one another. A tantalum sputtering component includes a mean grain size of less than about 100 microns and a uniform texture throughout the component thickness. The uniform texture can be predominately {111}<uvw>.

6 Claims, 9 Drawing Sheets

TANTALUM SPUTTERING TARGET WITH FINE GRAINS AND UNIFORM TEXTURE AND METHOD OF MANUFACTURE

FIELD OF THE INVENTION

This invention relates to the processing of high-purity tantalum to produce a sputtering target with a microstructure that is desirable for uniform sputtering. In particular, the invention relates to the manufacture of high-purity tantalum with a mean grain size of less than 100 μm and a uniform, predominately (111)<uvw> crystallographic texture throughout the target thickness.

BACKGROUND OF THE INVENTION

Tantalum is currently used extensively in the electronics industry, which employs tantalum in the manufacture of highly effective electronic capacitors. Its use is mainly attributed to the strong and stable dielectric properties of the oxide film on the anodized metal. Both wrought thin foils and powders are used to manufacture bulk capacitors. In addition, thin film capacitors for microcircuit applications are formed by anodization of tantalum films, which are normally produced by sputtering. Tantalum is also sputtered in an Ar—$N_2$ ambient to form an ultra thin TaN layer which is used as a diffusion barrier between a Cu layer and a silicon substrate in new generation chips to ensure that the cross section of the interconnects can make use of the high conductivity properties of Cu. It is reported that the microstructure and stoichiometry of the TaN film are, unlike TiN, relatively insensitive to the deposition conditions. Therefore, TaN is considered a much better diffusion barrier than TiN for chip manufacture using copper as metallization material. For these thin film applications in the microelectronics industry, high-purity tantalum sputtering targets are needed.

The typical tantalum target manufacturing process includes electron-beam (EB) melting ingot, forging/rolling ingot into billet, surface machining billet, cutting billet into pieces, forging and rolling the pieces into blanks, annealing blanks, final finishing and bonding to backing plates. The texture in tantalum plate is very dependent on processing mechanisms and temperatures. According to Clark et al. in the publication entitled "Effect of Processing Variables on Texture and Texture Gradients in Tantalum" (*Metallurgical Transactions A,* September 1991), the texture expected to develop in cold-rolled and annealed bcc metals and alloys consists of orientations centered about the ideal orientations, {001}<110>, {112}<110>, {111}<110>, and {111}<112>. Generally, conventionally processed tantalum is forged or rolled from ingot to final thickness, with only one (1) or no intermediate annealing stages. A final anneal is usually applied to the plate simply to recrystallize the material. The direction of the deformation influences the strengths of resulting annealed textures but generally little attention is given to the resulting distribution of textures. In conventionally processed tantalum, significant texture variation exists in the cross-section of the plate, as described by Clark et al. (August 1992), Raabe et al. (1994), Michaluk (1996). Typically the above mentioned textures exist in stratified bands through the thickness of the rolled plate, or form a gradient of one texture on the surface usually {100}<uvw>, with a gradual transition to a different texture at the centerline of the plate, usually {111}<uvw>, Wright et al. (1994). Another cause of texture variation through the target thickness is the non-uniformity of the deformation processes used to form the plate. Texture non-uniformity results in variable sputter deposition rates and sputter surface irregularities, which in turn is believed to be a source of micro-arcing. Micro-arcing is believed to believed to be the principle cause of particle generation and is thus undesirable in the semiconductor industry. FIG. 1 shows the sputter surface of a mixed-texture tantalum target made by conventional processing methods. The sputter surface reveals regions of two different crystallographic textures; dark areas are {100}<uvw>, lighter areas {111}<uvw>. The type of pattern illustrated in FIG. 1 is believed to contribute to sputter film nonuniformities because of the different sputter rates associated with each texture.

FIG. 2 shows severe textural banding in the cross-section of a sputtered tantalum target manufactured according to conventional processes. 'Textural banding', refers to a localized concentration of one texture in the cross section strung out over several grains in a matrix of another texture. In tantalum, it is typically {100}<uvw> textures in a matrix of the more prominent {111}<uvw> textures. For example, a series of grains with the same {100}<uvw> texture in a matrix of {111}<uvw> are aligned in an elongated manner over several grains is considered a banded textural feature. Using Electron Backscatter Diffraction, EBSD, imaging the texture in small, localized areas can be determined accurately.

In FIG. 2, it can be clearly seen that areas of {100}<uvw> type textures sputter at a greater rate than {111}<uvw> type textures. Thus, any textural non-uniformity at the target surface will produce surface 'ridges', which have an increased likelihood of causing micro-arcing.

SUMMARY OF THE INVENTION

In accordance with the present invention there is provided a processing route for producing high purity tantalum sputtering targets with a mean fine grain size of less than 100 microns and uniform crystallographic texture throughout the target thickness.

The method comprises forging, rolling and annealing high-purity, vacuum-melted tantalum ingots in such a way as to eliminate remnant as-cast grain structure, and produce a homogeneous fine-grain size (mean <100 μm) microstructure with a uniform, predominately {111}<uvw> texture throughout the thickness of the target. Significant sputtering problems have been reported when the texture of the target is not uniform throughout the target thickness. Sputtering rates and film deposition rates change as a function of target crystallographic texture. This variable sputter rate across a target surface causes film thickness uniformity problems and also produces unwanted surface topography in the form of 'ridging', which in turn is believed to cause micro-arcing.

This invention uses a series of deformation techniques, with a minimum of three (3) intermediate, high-temperature inert-atmosphere anneals, preferably vacuum, to produce a combination of fine-grain size (mean <100 μm) tantalum targets with a uniform, predominately {111}<uvw> texture throughout the target thickness, until now unseen in the industry today. 'Uniform texture throughout the target thickness' refers to a homogeneous distribution of textural components with no visible banding at a resolution of 20× from the target surface to at least mid-thickness. 'Inert' refers to an atmosphere that is non-reactive with the tantalum-comprising mass.

Experiments associated with this invention also revealed that by controlling the annealing temperature the most desirable texture for collimated sputtering, the (111) texture, can be generated. The (111) texture is the only texture that has one of the close-packed directions aligned normal to the target surface. This direction is a dominant emission direction and is, therefore, the texture required for collimated sputtering.

The high-purity tantalum material of the present invention is preferably 3N5 (99.95%) pure and comprises less than 500 ppm total metallic impurities, excluding gases. The methods of chemical analysis used to derive the chemical descriptions set forth herein are the methods known as glow discharge mass spectroscopy (GDMS) for metallic elements and LECO gas analyzer for non metallic elements.

For the purposes of this invention, the term "sputtering target" covers not only sputtering targets in the traditional sense, but also any other component within the sputtering chamber that is likely to sputter.

BRIEF DESCRIPTION OF THE DRAWINGS

FIG. 9($b$) is a photograph of an experimental sputtering target manufactured by the process of the present invention (Process 12).

DETAILED DESCRIPTION

Figure 1:
FIG. 1 is a photograph of a used high purity tantalum sputtering target with a non-uniform texture throughout the target thickness.
Figure 2:
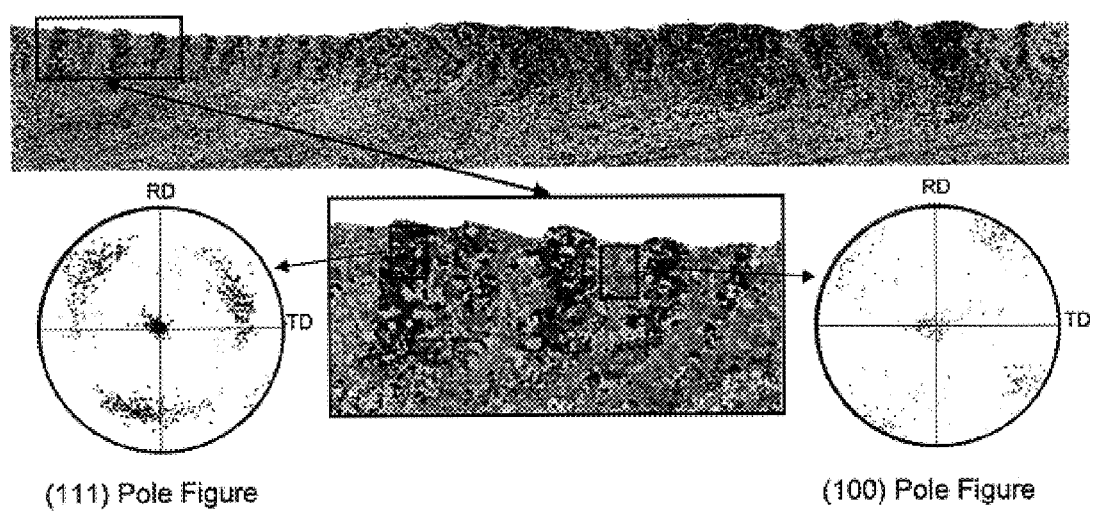
FIG. 2 is a cross-sectional EBSD image of a conventionally processed, severely banded sputtered tantalum target.
Figure 3:
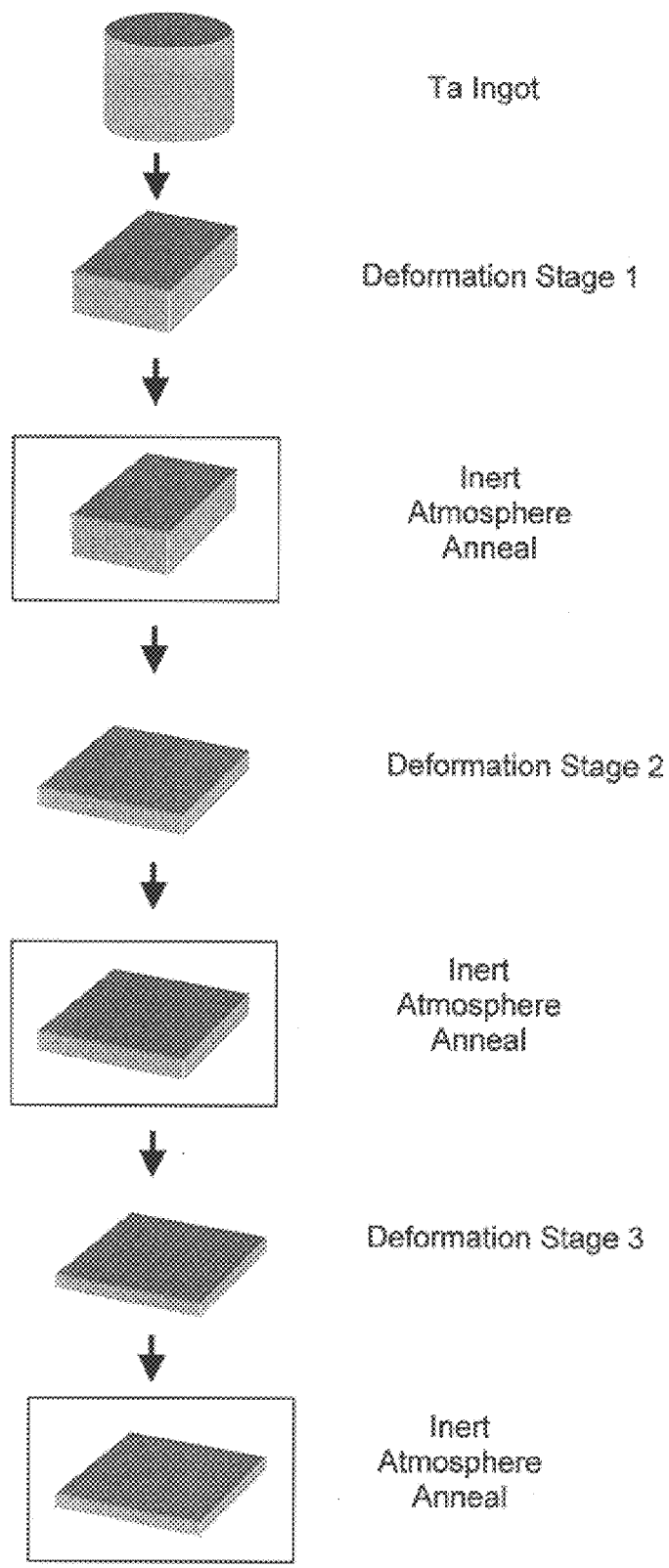
FIG. 3 is a schematic of the process of the present invention.
Figure 4:
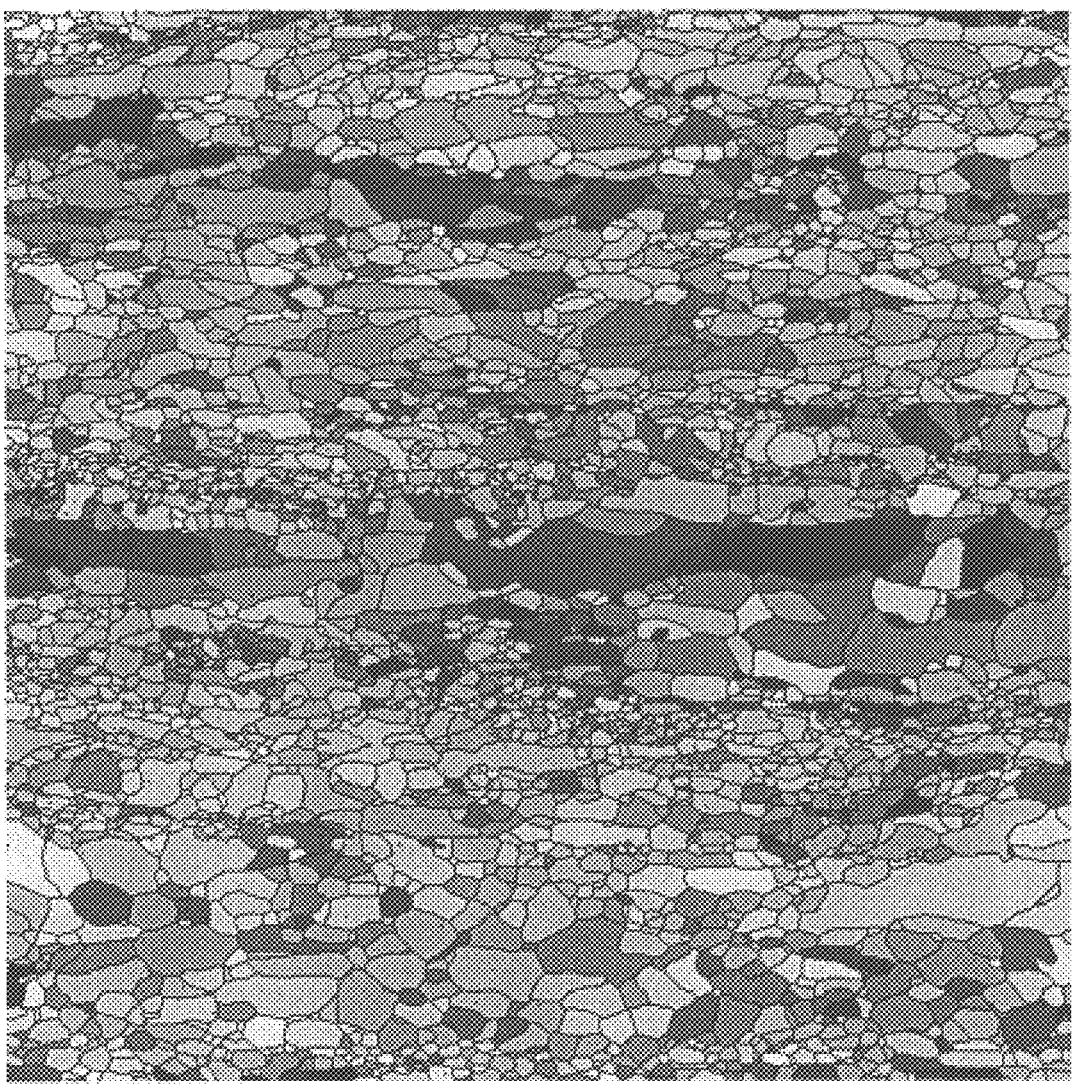
FIG. 4 is a cross-sectional EBSD image of a conventionally processed (Process 2), severely banded high-purity tantalum sputter target.
Figure 5:
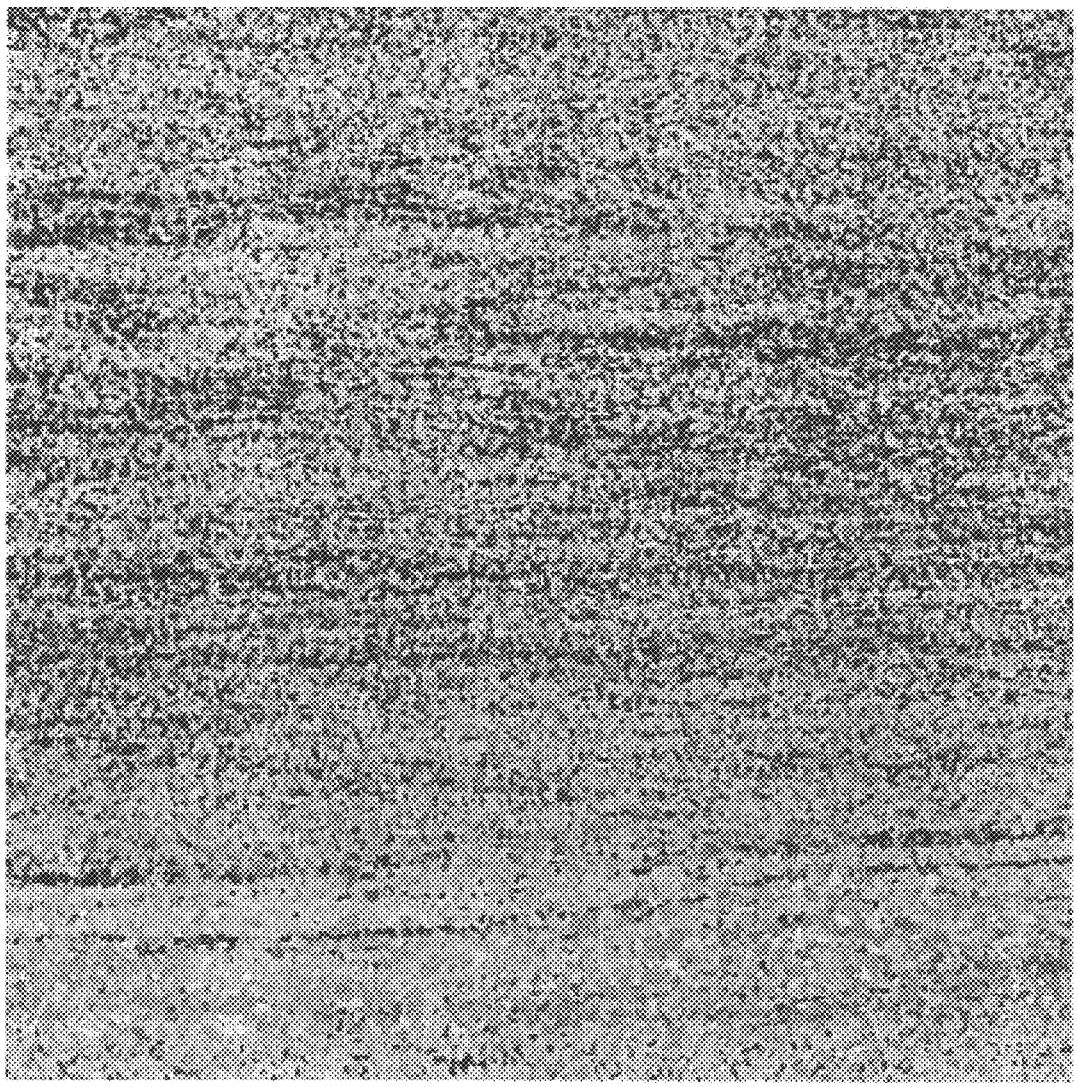
FIG. 5 is a cross-sectional EBSD image of a conventionally processed (Process 3), high-purity tantalum sputtering target.
Figure 6:
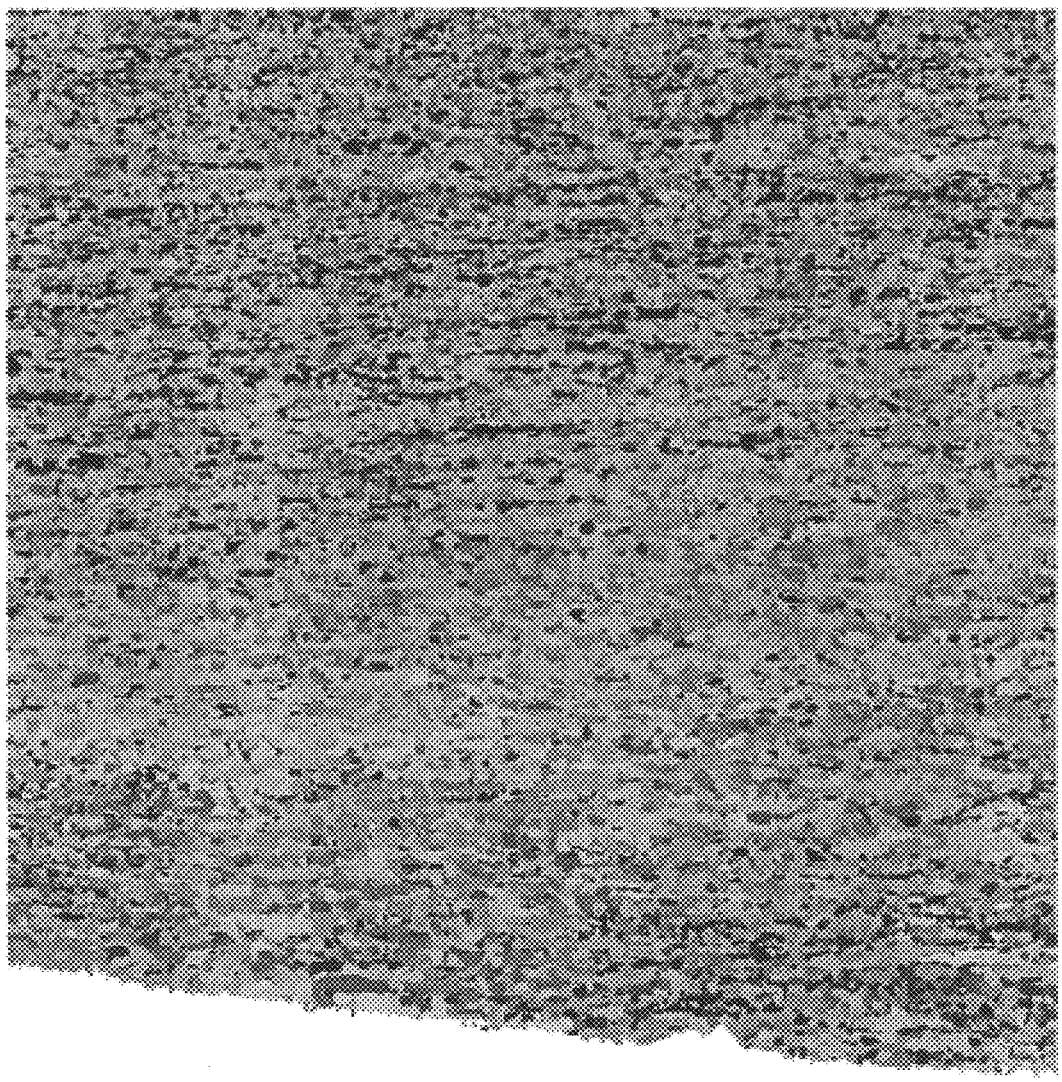
FIG. 6 is a cross-sectional EBSD image of a high-purity tantalum sputter target manufactured by Process 4.
Figure 7:
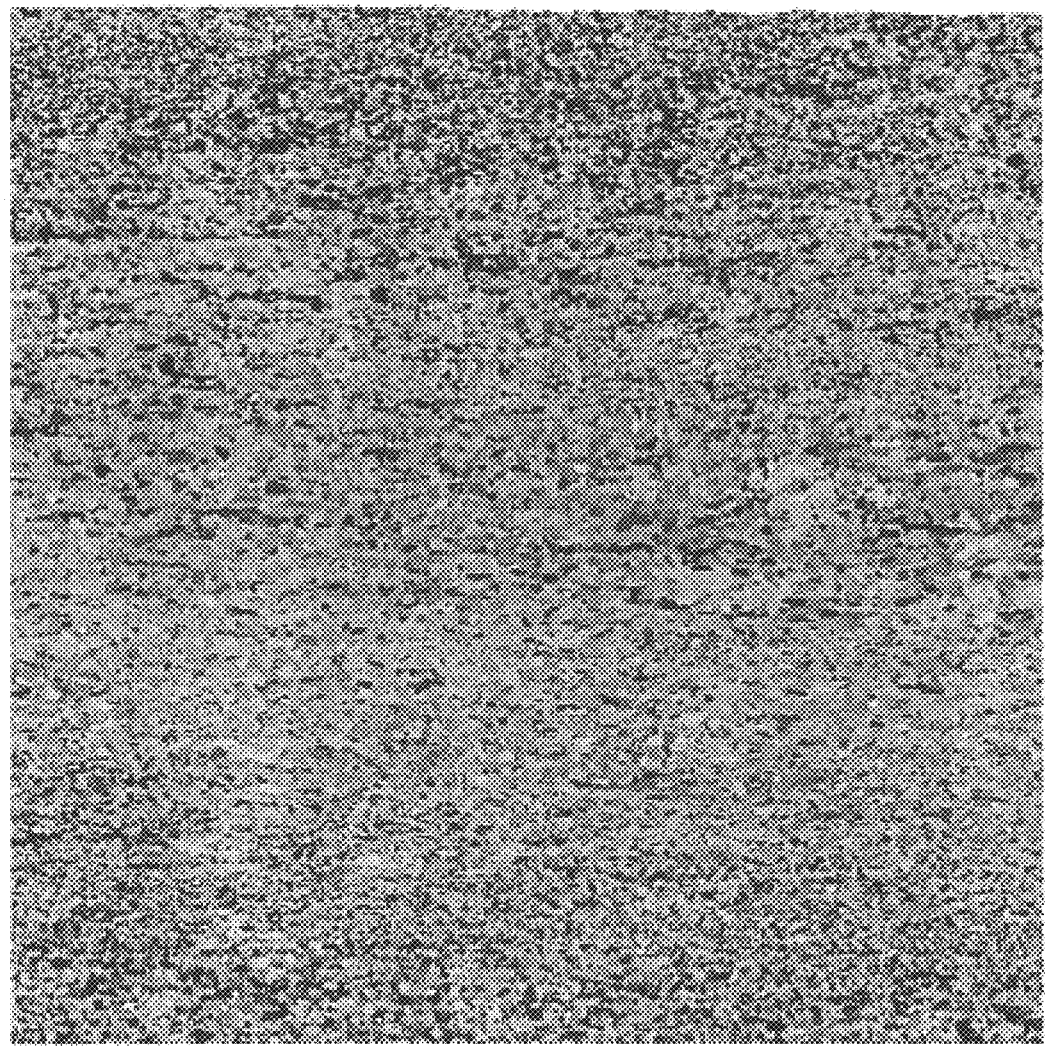
FIG. 7 is a cross-sectional EBSD image of a high-purity tantalum sputter target manufactured by Process 7.

Electron beam (EB), Vacuum Arc Melted (VAR) or other vacuum melted tantalum ingots are deformed perpendicular to the ingot centerline to break up the as-cast grain microstructure. This deformation can be forging, rolling or extrusion whereby significant cross-sectional area or thickness reduction takes place. The reduction in cross-sectional area should be greater than a reduction ratio of 3:1 (cross-sectional area of ingot to cross-sectional area of the forged billet), or equivalent to no less than about 40% strain reduction from starting thickness to final thickness. The forged billet should then be annealed in an inert atmosphere, preferably vacuum, at a high temperature (1500 F.–2800 F.), preferably between 2200 F. and 2400 F., in order to achieve a recrystallized microstructure. The resulting billet/plate is then deformed no less than an additional 35%, preferably 45–65%, of its thickness and subjected to a second high-temperature inert atmosphere anneal between 1500 F. and 2800 F., preferably between 2200 F. and 2400 F. The process of the present invention comprises an additional deformation step with a strain >60% followed by a final inert-atmosphere anneal (1500 F.–2800 F.) to recrystallize the microstructure to the desired fine grain size. FIG. 3 is a schematic of the invented process. The deformation directions to achieving the desired results. The process of this invention preferably utilizes no less than three deformation steps and no less than three inert-atmosphere anneal steps from ingot to final target plate thickness in order to achieve the desired results. Three or more deformation and intermediate inert-atmosphere, high-temperature annealing stages are more likely to eliminate grain size and textural banding while maintaining a mean grain size of less than 100 microns than would less than 3 deformation and annealing stages.

EXAMPLE 1

Twelve high-purity tantalum ingots were processed according to conventional methods or the process of this invention. The parameters for each experiment and the corresponding grain size and texture results are summarized in Table 1. Texture uniformity was measured by cutting samples from the target and analyzing them using an EBSD system on a scanning electron microscope (SEM). The mapped area was 7 mm×7 mm and was measured from the target surface to at least the plate mid-thickness. The lighter areas depict {111}<uvw> textures and the darker areas depict {100}<uvw> textures.

Figure 8:
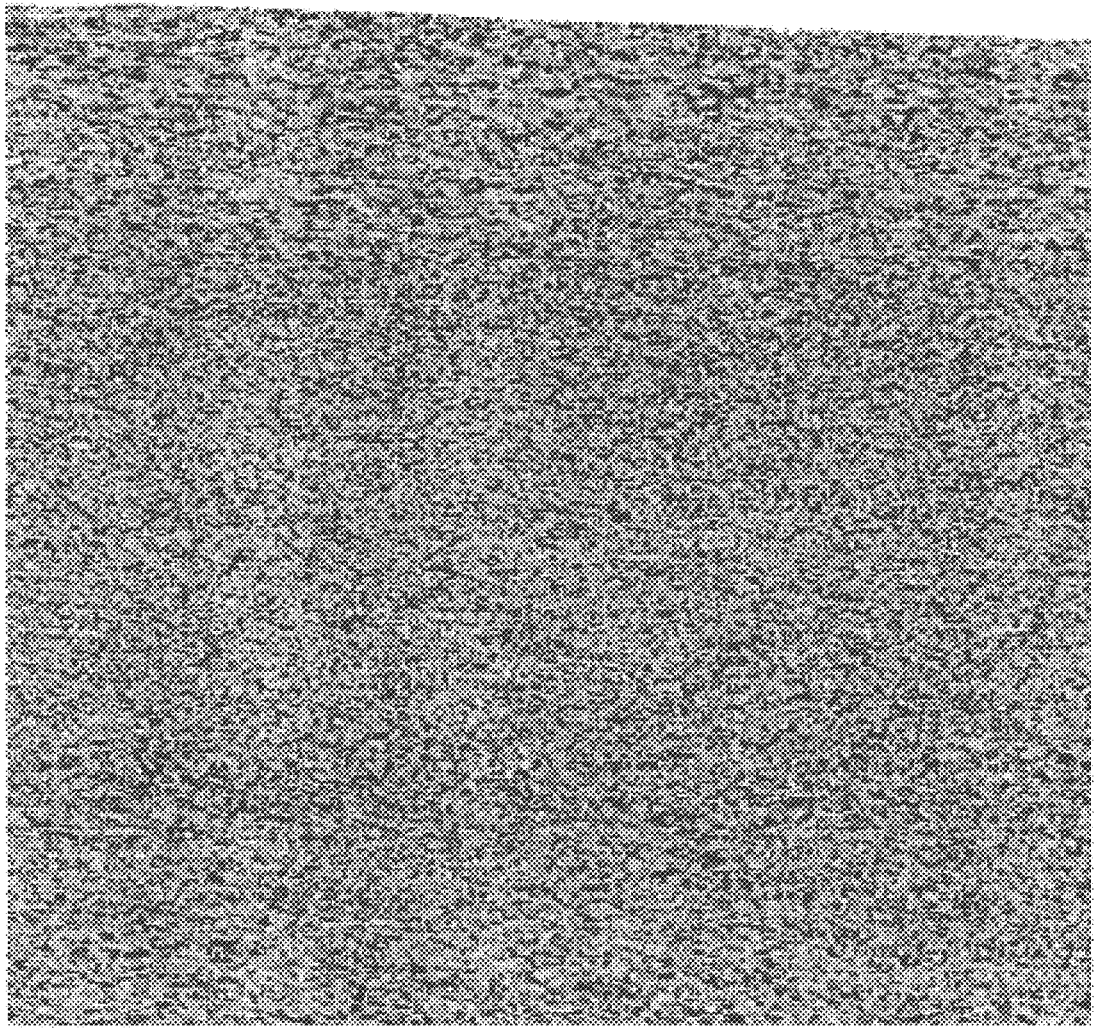
FIG. 8 is a cross-sectional EBSD image of a high-purity tantalum sputter target manufactured by the process of the present invention (Process 12).

The ingots processed by conventional methods (Processes 1 through 7) exhibited a banded microstructure in both grain size and texture. FIGS. 4, 5, 6 and 7 illustrate the extent of this banding. The ingots manufactured by the invented process (Processes 8 through 12) have a strong {111}<uvw> textures with a random distribution of {100}<uvw> textures. FIG. 8, which represents product of the present invention, shows a high degree of textural uniformity throughout the target cross-section, with no banding.

Although the experimental data shows the grain size results to be less than about 50 $\mu$m it is expected that a grain size of less than 100 $\mu$m will produce similar sputtering results, so long as the texture is uniform throughout the target thickness.

TABLE 1

|  | Process 1 Conven | Process 2 Conven | Process 3 Conven | Process 4 Conven | Process 5 Conven | Process 6 Conven |
|---|---|---|---|---|---|---|
| Ingot Melting Process | VAR | E-Beam | E-Beam | E-Beam | E-Beam | E-Beam |
| Purity | 4N | 4N | 3N5 | 3N5 | 4N | 3N8 |
| Ingot break-up (Stage1 deformation) | None | None | >40% | >40% | None | >40% |
| High-temperature, inert-atmosphere anneal? | No | No | No | Yes | No | Yes |
| Stage 2 deformnation | >40% | >40% | >40% | >40% | >40% | >40% |

TABLE 1-continued

|  |  |  |  |  |  |  |
|---|---|---|---|---|---|---|
| High-temperature, inert-atmosphere anneal? | Yes | Yes | Yes | Yes | Yes | No |
| Stage 3 deformation | — | — | — | — | >60% | >60% |
| High-temperature, inert-atmosphere anneal? | — | — | — | — | Yes | — |
| Number of anneals | 1 | 1 | 1 | 2 | 2 | 2 |
| Mean grain size (μm) | Banded 50–250 μm | Heavy Banding 100–250 μm | 35 μm | 55 μm | Banded 50–200 μm | 30 μm |
| Texture Description | Mixed (111) & (100), banded | Mixed (111) & (100), banded | Mixed (111) & (100), banded | (111) with banded (100) | Mixed (111) & (100), banded | Mixed (111) & (100), Extreme banded |
| Texture uniformity through thickness | Very Poor | Very Poor | Poor | Poor | Poor | Very Poor |

|  | Process 7 Conven | Process 8 Invention | Process 9 Invention | Process 10 Invention | Process 11 Invention | Process 12 Invention |
|---|---|---|---|---|---|---|
| Ingot Melting Process | E-Beam | E-Beam | E-Beam | E-Beam | E-Beam | E-Beam |
| Purity | 3N8 | 3N8 | 3N8 | 4N | 3N8 | 3N8 |
| Ingot break-up (Stage1 deformation) | >40% | >40% | >40% | >40% | >40% | >40% |
| High-temperature, inert-atmosphere anneal? | Yes | Yes | Yes | Yes | Yes | Yes |
| Stage 2 deformnation | >40% | >40% | >40% | >40% | >40% | >40% |
| High-temperature, inert-atmosphere anneal? | No | Yes | Yes | Yes | Yes | Yes |
| Stage 3 deformation | >60% | >60% | >60% | >60% | >60% | >60% |
| High-temperature, inert-atmosphere anneal? | Yes | Yes | Yes | Yes | Yes | Yes |
| Number of anneals | 2 | 3 | 3 | 3 | 3 | 3 |
| Mean grain size (μm) | 37 μm | 35 μm | 5 μm | 45 μm | 39 μm | 22 μm |
| Texture Description | (100) at surface and (111) at centerline | Strong (111) with random distribution of (100) | Strong (111) with random distribution of (100) | Strong (111) with random distribution of (100) | Strong (111) with random distribution of (100) | Strong (111) with random distribution of (100) |
| Texture uniformity through thickness | Poor | Good | Excellent | Excellent | Excellent | Excellent |

EXAMPLE 2

Figure 9:
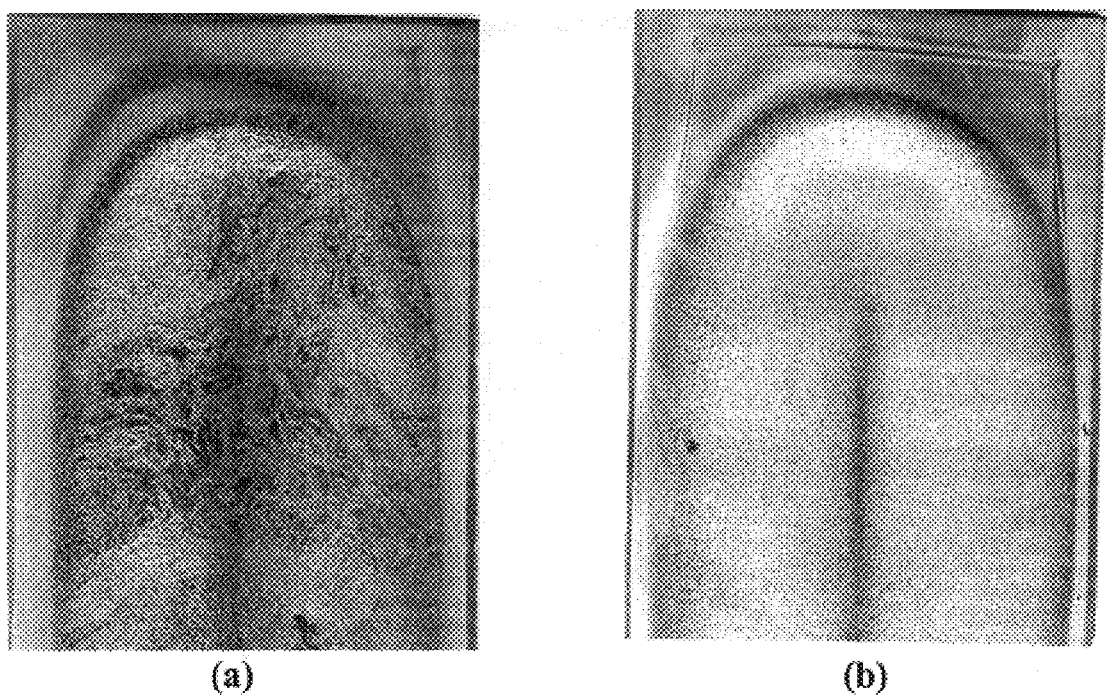
FIG. 9($a$) is a photograph of the experimental sputtering targets manufactured by the conventional method (Process 4).

Sputter trials were conducted on a conventional high-purity tantalum target and a target processed according to this invention in order to compare the sputtering characteristics. FIG. 9(a) and FIG. 9(b) are photographs of the used conventional and invented targets, respectively. The conventional target exhibits extensive surface roughness which is associated with non-uniform sputtering. This surface 'ridging' in turn increases the likelihood of micro-arcing and sputter film non-uniformity. In contrast, the target processed according to this invention exhibits a smooth evenly-sputtered surface.

What is claimed is:

1. A tantalum sputtering component comprising a mean grain size of less than about 100 microns and a uniform texture that is predominately {111}<uvw> throughout a thickness of the component.

2. A tantalum sputtering component according to claim 1 comprising at least 99.95% tantalum, excluding gases.

3. A thin film of tantalum produced by a sputtering component according to claim 1.

4. A tantalum sputtering component comprising a mean grain size of less than about 50 microns and a uniform texture that is predominately {111}<uvw> throughout a thickness of the component.

5. A tantalum sputtering component according to claim 4 comprising at least 99.95% tantalum, excluding gases.

6. A thin film of tantalum produced by a sputtering component according to claim 4.

* * * * *